«USPTO» United States Patent [19]

Hong

[11] Patent Number: 5,525,535
[45] Date of Patent: Jun. 11, 1996

[54] METHOD FOR MAKING DOPED WELL AND FIELD REGIONS ON SEMICONDUCTOR SUBSTRATES FOR FIELD EFFECT TRANSISTORS USING LIQUID PHASE DEPOSITION OF OXIDES

[75] Inventor: Gary Hong, Hsin-Chu, Taiwan

[73] Assignee: United Microelectronics Corporation, Hsin-Chu, Taiwan

[21] Appl. No.: 507,538

[22] Filed: Jul. 26, 1995

[51] Int. Cl.⁶ .................................................. H01L 21/76
[52] U.S. Cl. .................. 437/70; 437/69; 437/28; 437/931; 437/26; 148/DIG. 70
[58] Field of Search ................................. 437/69, 70, 28, 437/931, 26; 149/DIG. 70

[56] References Cited

U.S. PATENT DOCUMENTS

| | | | |
|---|---|---|---|
| 4,277,291 | 7/1981 | Cerofolini et al. | 437/70 |
| 4,459,741 | 7/1984 | Schwabe et al. | 437/931 |
| 4,574,467 | 3/1986 | Halfacre et al. | 437/28 |
| 4,987,093 | 1/1991 | Teng et al. | 437/69 |
| 5,256,593 | 10/1993 | Iwai | 437/70 |
| 5,429,956 | 7/1995 | Shell et al. | 437/26 |
| 5,453,395 | 9/1995 | Lur | 437/67 |

*Primary Examiner*—Trung Dang
*Attorney, Agent, or Firm*—William H. Wright

[57] ABSTRACT

A method of forming doped well regions for FETs and doped field regions for channel stops to prevent surface inversion under the field oxide was achieved using a single ion implantation. The method involves forming a patterned silicon oxide layer over the field regions by selective deposition using liquid phase deposition (LPD) and a patterned photoresist mask. An ion implantation through the thick LPD silicon oxide layer over the field regions and through a thinner silicon nitride layer over the well regions resulted in a shallow doped field region and a deep doped well region. After removing the LPD oxide in HF, LOCOS was used to form the field oxide drive-in the dopant and anneal out the implant damage. After removing the silicon nitride layer over the well regions, gate oxides, polysilicon gate electrodes, and source/drains areas are formed to complete the FETs. The LPD process resulted in a doped field region self-aligned to a doped well region that required fewer masking and implant steps. The method is applicable to the fabrication of N and P-FETs for CMOS circuits.

27 Claims, 2 Drawing Sheets

METHOD FOR MAKING DOPED WELL AND FIELD REGIONS ON SEMICONDUCTOR SUBSTRATES FOR FIELD EFFECT TRANSISTORS USING LIQUID PHASE DEPOSITION OF OXIDES

BACKGROUND OF THE INVENTION

1. Field of the Invention

The present invention relates to integrated circuit devices on semiconductor substrates, and more particularly to a method for fabricating N and P doped wells for field effect transistors, (FETs) and concurrently forming N and P doped field regions under the field oxide isolation regions on semiconductor substrates.

2. Description of the Prior Art

The density of field effect transistors (FETs) formed on integrated circuit chips diced from semiconductor substrates have dramatically increased in recent years. As the number and the density of transistors continue to increase on the chip the power consumption on the chip significantly increases. To avoid the heating effect on the chip and minimize the cooling requirements on these ultra larger scale integration (ULSI) circuits it is common practice in the electronics industry to rely on circuits that consume less power. One important circuit technology for minimizing the power consumption is the Complimentary Metal-Oxide-Semiconductor (CMOS) circuit. The CMOS circuits are typically formed from N-channel and P-channel FETs, and are particularly useful for the inverter circuit that form the basic building block for digital circuits, such as are used in computers and microprocessor.

Although the basic structure of early FETs used metal gate electrodes and silicon oxide gates on a silicon semiconductors, and where referred to as Metal-Oxide-Semiconductor FETs (MOSFETs), present day FETs are predominantly made with conductivity doped polycrystalline silicon (polysilicon) having decidedly better high temperature processing properties. However, it is still common practice in the industry to refer to the circuits made from these polysilicon gate electrode FET as CMOS circuits.

The P and N-channel FETs that comprise the CMOS circuit are, respectively, built on N and P doped wells that are formed in the top portion of the silicon substrate. The field effect transistors are electrically isolated from each other, usually by a relatively thick oxide formed on and in the substrate surface, referred to as the "field oxide" (FOX). It is a common practice in the semiconductor industry to form the field oxide by the method of LOCal Oxidation of Silicon (LOCOS). The LOCOS method involves forming a silicon oxide layer (pad oxide), usually by thermal oxidation of the substrate surface, and then depositing an oxidation barrier layer composed of silicon nitride. The silicon nitride layer is then patterned on the substrate using a photoresist mask and etching, exposing the substrate surface in the required field oxide areas while leaving portions of the nitride layer over the desired P and N-well areas. Prior to removing the photoresist mask a channel stop implant is usually formed in the exposed areas, and then after removing the photoresist the substrate is thermally oxidized to form the field oxide. The channel stop implant prevent inversion of the silicon surface under the field oxide, and thereby preventing electrical leakage currents between the isolated well regions. Typically, separate photoresist masking and ion implantation steps, either prior to or after forming the field oxide are required to form the P and N doped wells. Unfortunately, these additional masking and implant steps result in increased manufacturing cost and decreased yield.

A method for providing a field oxide with improved channel stop implants is described by C. W. Teng et al, U.S. Pat. No. 4,987,093, for both N and P-wells. However, methods for merging or integrating the process steps for forming the channel stop region and the well regions is not described.

There is still a strong need in the semiconductor industry for improving the CMOS semiconductor device process while providing a cost effective manufacturing processing.

SUMMARY OF THE INVENTION

It is a principle object of this invention to provide an improved CMOS circuit by forming P-doped and N-doped well regions that are self-aligned to the doped field regions (channel stop) under the field oxide areas using a method of liquid phase deposition (LPD) of silicon oxide.

It is another object of the invention to provide this improved CMOS structure while reducing the masking steps and implant steps by one for each doped well type, and thereby reducing the manufacturing cost.

The method begins by providing a semiconductor substrate having a principle surface that is planar, such as a single crystal silicon substrate having a <100> crystallographic orientation. A pad oxide is formed by thermal oxidation on the principle surface of the substrate, and then an oxidation barrier layer composed of silicon nitride ($Si_3N_4$), is deposited on the pad oxide layer. Photolithographic techniques and plasma etching are used to pattern the silicon nitride layer, leaving portions over the planned well regions (device areas) while exposing the pad oxide layer in the field oxide areas. The pattern being determined by the required circuit layout. Now an important feature of the present invention, a silicon oxide layer is selectively deposited by Liquid Phase Deposition (LPD) using the exposed surface of the pad oxide in the photoresist openings as a nucleation layer. After the LPD, the photoresist is removed by conventional means, using, for example, plasma ashing in oxygen. The substrate is subjected to an ion implantation having a implant dose and energy that provides the required dose and projected range $R_p$ in the well regions under the silicon nitride layer, and at the same time and by the same implant forming a doped field region in the silicon substrate under the LPD oxide to form the channel stop layer. The thickness of the LPD oxide and the silicon nitride layer are selected to provide the required projected range $R_p$ for the implant in the field and well regions. To form P and N-type well on the same substrate, the implantation can be performed twice using two photoresist masking steps and using a P type and an N type conductive dopant implant.

Now the liquid phase deposited silicon oxide and the pad oxide layers are selectively removed by etching in a hydrofluoric acid (HF) solution. The silicon nitride ($Si_3N_4$) layer remaining over the well regions essentially unetched. The silicon substrate is then subjected to a thermal oxidation to form a field oxide over the implant field regions, as in the LOCOS method. The thermal oxidation step also concurrently drives in the dopants and anneals out the implant damage forming both the doped well regions and the channel stop region under the field oxide. The silicon nitride is then removed, for example, using a hot phosphoric acid solution and the thin pad oxide is removed in a dilute hydrofluoric acid solution.

The substrate is now ready for forming the FETs in and on the surface of the doped well regions which is also commonly referred to as the device areas. The surface of the well regions are carefully cleaned and a good quality gate oxide is formed on the surface, usually by thermal oxidation. A polysilicon layer is then deposited and doped by implantation or in situ doped during the polysilicon deposition to form an electrically conducting layer. The polysilicon layer is patterned, for example, using a photoresist mask and anisotropic etching to form the gate electrodes and also interconnects elsewhere on the field oxide. The substrate is subjected to another implant to form the source/drain areas adjacent to the gate electrodes, and thereby completing the FETs.

As pointed out earlier, two masking and implant steps can be used to form P and N type wells, and in like fashion additional masking and implant steps can be used, as is commonly practiced in the industry, to form P and N doped gate electrodes and the P and N doped source/drain areas. By this method P-channel FETs are formed on the N wells and N-channel FETs are formed on the P-wells and the FETs can then be interconnected by further processing to form the required CMOS circuits.

The method of this invention provides an important alternative to the current state of the art methods by forming the doped wells and the doped field regions (channel stop) under the field oxide at the same time, and thereby reduces the number of masking steps while providing doped well regions and channel stop regions that are self-aligned to each other.

BRIEF DESCRIPTION OF THE DRAWINGS

The objects and other advantages of this invention are best explained in the detailed embodiment with reference to the attached drawings that include.

DESCRIPTION OF THE PREFERRED EMBODIMENTS

Now in keeping with the objects of this invention, the method of the embodiment is presented in detail for forming P doped wells (P-wells) self-aligned to a P doped channel stop layer under the field oxide (FOX) structure. Also described, for completeness, is the formation of field effect transistors on the P-well regions.

Although the invention is described for forming only P-wells on an silicon substrate, so as to simplify the discussion, it should be well understood by those skilled in the art, that the invention applies equally well to both $N^-$ doped and $P^-$ doped substrates. And it should also be well understood that the invention is applicable to forming both P and N doped well on the same substrate for the N and P-channel FETs that are required to build the CMOS circuits.

Figure 1:
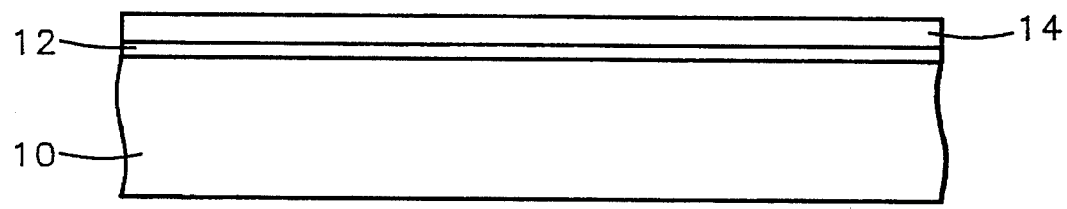
FIGS. 1 through 6 which illustrates in schematic cross sectional representation the embodiment of the invention in which ion implanting dopants through a liquid phase deposited patterned silicon oxide layer and a patterned silicon nitride layer form at the same time and with the same implant form doped wells and field regions.

Referring now to FIG. 1, a schematic cross-sectional view is shown of a substrate 10 composed of, for example, single crystalline silicon and having a <100> crystallographic orientation. The substrate can be either P doped, such as with boron (B) or alternatively, N doped with arsenic (As) having a preferred dopant concentration of between about $1.0\,E\,14$ to $1.0\,E\,16$ atoms/cm$^3$. The surface of the silicon substrate 10 is then thermally oxidized to form a pad oxide 12 composed of silicon oxide (SiO$_2$) and having a preferred thickness of between about 100 to 500 Angstroms. A silicon nitride layer 14 is then deposited on the pad oxide layer 12. For example, the silicon nitride can be deposited using a low pressure chemical vapor deposition (LPCVD) and a reactant gas mixture of dichlorosilane (SiCl$_2$H$_2$) and ammonia (NH$_3$). The deposition temperature is typically in a range of between about 700° to 800° C. The preferred thickness of layer 14 is between about 800 to 2000 Angstroms. The nitride layer 14 later serves as an oxidation barrier layer.

Figure 2:
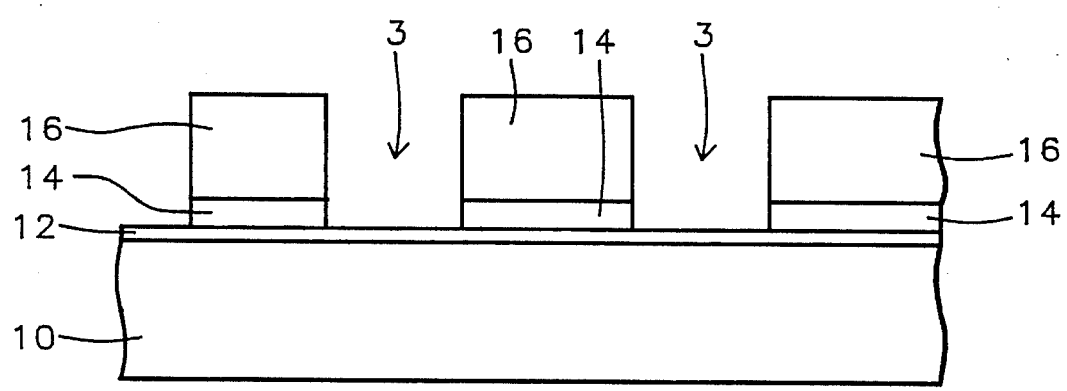

Referring now to FIG. 2, a photoresist masking layer 16 is spin coated on the substrate and patterned by lithographic means. The portions of the photoresist layer remain over the designated well regions (device areas) while exposing the nitride layer 14 in areas 3 where the doped field oxide regions (channel stop regions) and the field oxide (FOX) are to be later formed. The silicon nitride in the exposed areas 3, as shown in FIG. 2 is then etched to the pad oxide 12 by anisotropic plasma etching. The plasma etching, for example, can be performed in a reactive ion etcher (RIE) or other high plasma density etcher using, for example, an etch gas containing sulfur hexafluoride (SF6) and helium (He), alternatively, an etch gas containing carbon tetrafluoride (CF$_4$) and a carrier gas such as argon (Ar) can also be used.

Figure 3:
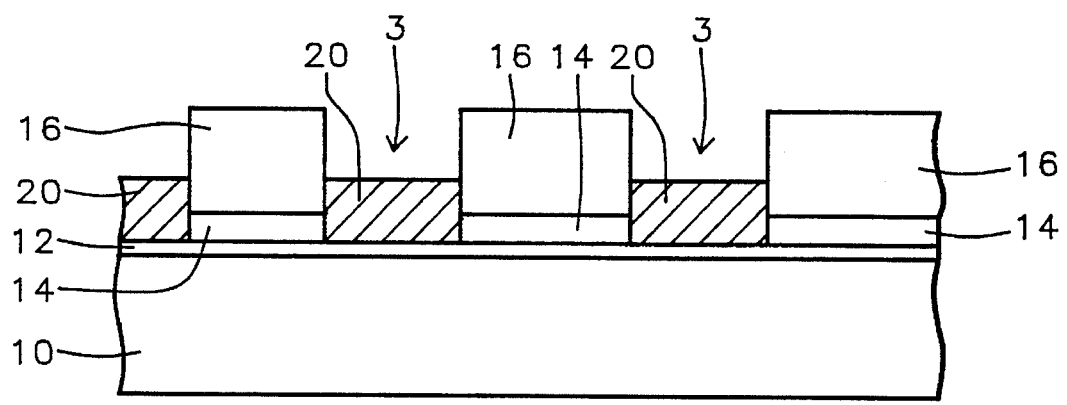

An important feature of this invention is the selective deposition of a silicon oxide 20 in the exposed areas 3 in the patterned photoresist mask.16, as shown in FIG. 3. The silicon oxide layer 20 is selectively deposited in the exposed areas by liquid phase deposition (LPD), in which the exposed surface of the pad oxide layer 12 serves as a nucleation layer for the deposition of the LPD oxide 20. The LPD oxide 20 is later used as an implant layer to control the depth of the implant in the silicon substrate 10 in the field region, and therefore the thickness of layer 20 is determined by a number of process parameters, as will become clear later in the process. However, the thickness of the LPD layer 20 is preferably between about 2000 to 6000 Angstroms.

The preferred deposition of the LPD silicon oxide layer 20 is accomplished in a supersaturated solution of hydrofluosilicic acid (H$_2$SiF$_6$). The method more specifically involves dissolving a pure silicon oxide power, such as formed by the sol-gel method from tetraethoxysilane (TEOS), in a H$_2$SiF$_6$ acid solution to form a saturated solution at about 25° C. For example, the hydrofluorsilicic acid being 40 percent by weight in aqueous solution is manufactured by the Morita Kagaku Kogyo Co. Ltd of Japan. The saturated solution is then transferred to a Teflon vessel for film deposition and maintained at a temperature of between about 33° to 37° C. by a water bath. The substrates are then immersed in the solution for liquid phase deposition (LPD). During the deposition an aqueous solution of boric acid (H$_3$BO$_3$) is continuously added by a controlled drip rate and magnetic stirring to maintain the super-saturated condition. The pad oxide layer 12 previously formed on the silicon substrate 10 and exposed in the photoresist layer openings 3 provide an important function as the nucleating layer on which the siloxane oligemers selectively deposits to form the silicon oxide layer.

As shown in FIG. 3, a timed LPD deposition is used to selectively and partially fill the openings 3 in the patterned photoresist layer 16 with a LPD silicon oxide layer 20 to the required thickness. The photoresist masking layer 16 is removed by conventional means, such as plasma ashing in an oxygen ambient.

Figure 4:
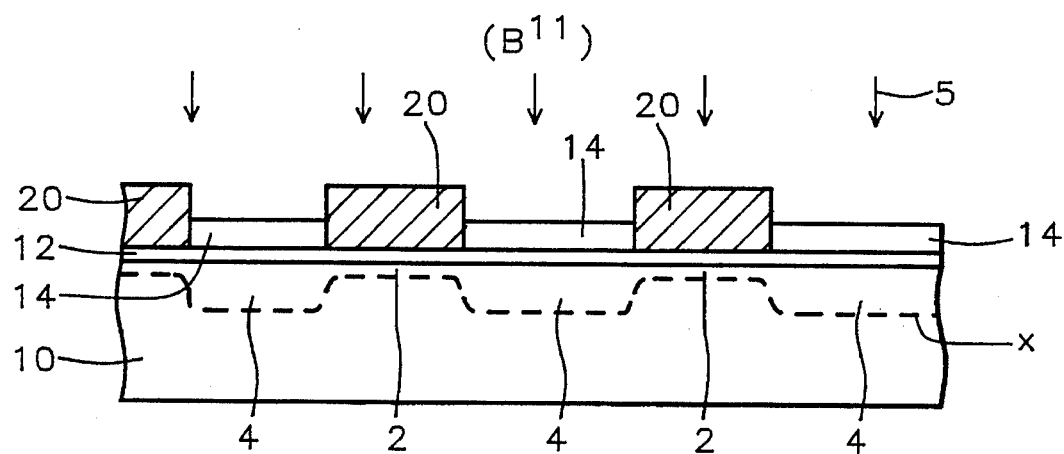

The substrate is next subjected to an ion implantation at normal incidence to the surface, as depicted by the vertical downward pointing arrows 5 in FIG. 4. For the purpose of simplifying the discussion and the drawing in the FIGS. of this embodiment, the process is described for forming the P doped well regions and P doped field regions (channel stop implants) using a boron ($B^{11}$) implantation. However, it should be understood that the implant dopant can likewise be N type, such as phosphorus ($P^{31}$) ions, and the well and field regions would then be N-type. And further, if two additional photoresist block out masks are used and both implants are performed, then both N and P type wells and doped field regions are provided on the same substrate and both P-channel and N-channel FETs can be fabricated for the purpose of forming CMOS circuits.

Referring still to FIG. 4, a single boron ion ($B^{11}$) implantation is used to implant through the LPD silicon oxide 20 and also through the silicon nitride 14 and pad oxide 12 layers, to concurrently form the P-doped field regions 2 (channel stop) and the P-doped well regions 4. The thickness of the LPD oxide 20 and the silicon nitride layer 14 and the implant energy of the boron are selected so that the projected range ($R_p$) for the implant is in and near the substrate surface for the P-doped field region 2 and below the substrate surface in the P-well region 4, as depicted by the broken line X in FIG. 4. For the thickness ranges cited earlier for the LPD oxide layer 20, silicon nitride layer 14 and the pad oxide layer 12, the preferred range for the ion energy for the boron 11 implantation is between about 100 to 500 KeV, and the preferred implant dose is between about 5 E 12 to 5 E 13 atoms/cm$^2$.

An important feature of this invention it the use of a single implant to form the doped field and doped well regions 2 and 4, and thereby reducing the number of photoresist masking steps and the implant steps.

By way of example only, if the thickness of the LPD oxide layer 20 is about 3800 to 4000 Angstroms, the thickness of the silicon nitride layer 14 about 600 to 800 Angstroms, and the pad oxide layer 12 thickness about 100 to 200 Angstroms, then the preferred implant energy for boron ($B^{11}$) is about 190 to 210 KeV. At these processing parameters the projected range $R_p$ through the multilayers results in a $R_p$ that lies about 0.1 to 0.2 micrometers (um) below the surface of the silicon substrate 10 in the field region 2 and at a depth of about 0.4 to 0.5 um below the surface of the substrate 10 in the P-well region 4.

For an N doped well and field region using a phosphorus 31 ($P^{31}$) ion implantation the projected implant range is less because of the increase nuclear mass of $P^{31}$. Therefore, to achieve a similar projected range $R_p$ in the example the implant energy should be about 450 to 500 KeV. A typical implant dose is between about 5.0 E 12 to 5.0 E 13 atoms/cm$^3$, and a typical implant energy is in the range of 100 to 500 KeV.

Figure 5:
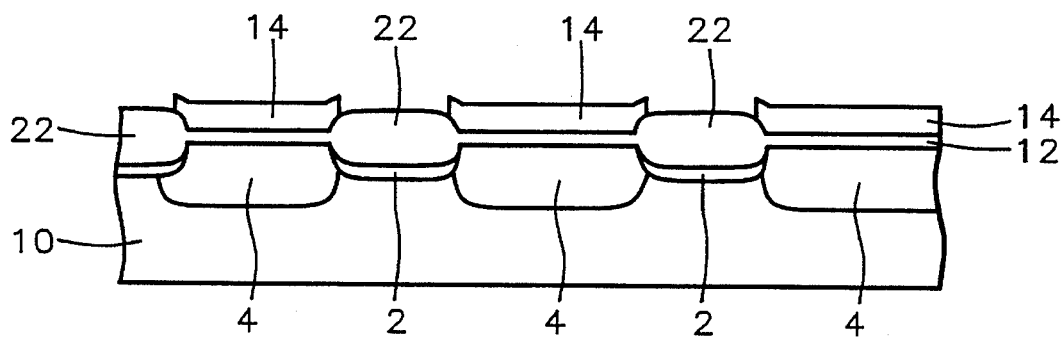

Continuing now with the fabrication and referring to FIG. 5, the LPD silicon oxide layer 20 and the pad oxide layer 12 are removed selectively over the doped field regions 2. For example, a wet etch in a dilute solution of hydrofluoric acid (HF/$H_2O$) can be used to remove the silicon oxide, while leaving essentially unetched the silicon nitride layer 14 that protects the doped well regions 4. Alternatively, the pad oxide 12 can be removed using a plasma etch which is selective to the silicon nitride layer 14 and the silicon sustrate 10.

A field oxide layer 22 is grown on the doped field regions 2, a shown in FIG. 5. by the LOCOS method while the silicon nitride layer 14 prevents the P-well regions 4 from oxidizing. The thermal oxidation is typically performed in an oxidation furnace using an oxidizing ambient of oxygen ($O_2$) or water ($H_2O$), and an oxidation temperature of between about 900° to 1000° C. The field oxide 22 is preferably grown to a thickness of between about 2000 to 8000 Angstroms.

Figure 6:
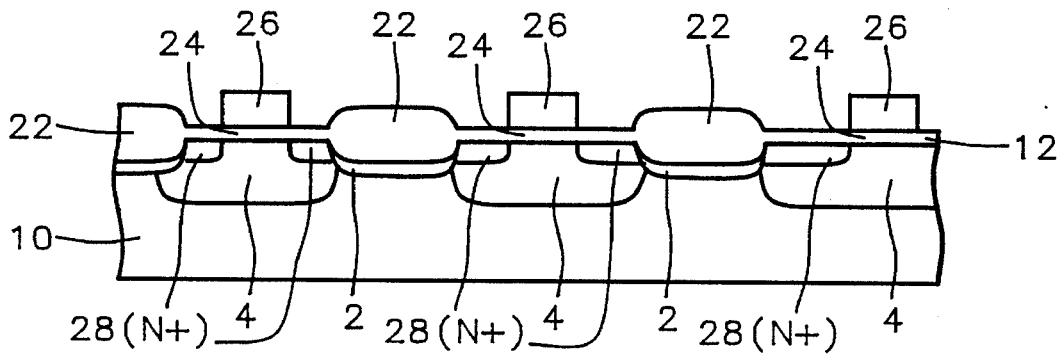

As shown in FIG. 6, after completing the field oxidation step, the silicon nitride mask layer 14 is removed, typically in a hot phosphoric acid ($H_3PO_4$) etch solution at a bath temperature of between about 155° to 180° C., and the pad oxide layer 12, thereunder is removed using a dilute HF/$H_2O$ solution.

The silicon substrate 10 having the P-well regions 4 and the self-aligned P doped field regions 2 formed by the method of this invention are now ready for the formation of the N-channel FETs. A gate oxide layer 24 is formed on the surface of the P-well regions, typically by thermal oxidation in a oxygen ambient, and the thickness of the gate oxide layer 24 is preferably between about 50 to 150 Angstroms.

The gate electrodes for the N-channel FETs are now fabricated by depositing a polysilicon layer 26, which is either in situ doped with arsenic or phosphorus during the deposition or doped by ion implantation after the layer 24 is deposited undoped. The polysilicon is preferably deposited using a low pressure chemical vapor deposition (LPCVD) and a reactant mixture containing silane ($SiH_4$). The preferred dopant is atomic arsenic or phosphorus having a concentration in the polysilicon layer 26 of between about 1 E 19 to 1 E 21 atoms/cm$^3$, and the preferred thickness of the layer 26 is between about 1000 to 5000 Angstroms. The doped polysilicon layer 26 is patterned by photolithography and anisotropic etching to form the gate electrode 26, as shown in FIG. 6. Source/drain areas 28 are formed by ion implantation, aligned to the gate electrodes having an ion implant dose of between about 1 E 13 to 1 E 15 atoms/cm$_2$ and an ion implant energy of between about 20 to 80 Kev, and thereby completing the N-channel FETs.

While the invention has been particularly shown and described with reference to the preferred embodiments thereof, it will be understood by those skilled in the art that various changes in form and details may be made without departing from the spirit and scope of the invention.

What is claimed is:

1. A method for concurrently fabricating doped well regions and doped field regions under field oxide areas on a semiconductor substrate, comprising the steps of:

providing a semiconductor substrate having a principle surface that is planar;

forming a blanket pad oxide layer on said substrate planar surface;

depositing a blanket silicon nitride layer on said pad oxide layer;

coating a photoresist layer on said silicon nitride layer; and patterning said photoresist layer leaving portions of said photoresist layer over planned device areas and exposing said silicon nitride layer elsewhere on said substrate over said field oxide areas;

anisotropic etching said silicon nitride layer to said pad oxide surface in said exposed silicon nitride areas;

depositing selectively by liquid phase deposition (LPD) an insulating layer on said pad oxide in said exposed areas;

removing said patterned photoresist layer over said device region;

blanket implanting a dopant by ion implantation through said LPD insulating layer and through said silicon nitride and pad oxide layers, and thereby forming doped field regions in said substrate under said LPD insulating layer and self-aligned doped well regions under said silicon nitride and pad oxide layers;

etching selectively said LPD insulation layer and said pad oxide layer and exposing said substrate surface, and leaving said patterned silicon nitride layer elsewhere on said substrate;

thermally and selectively oxidizing said exposed substrate surface and thereby forming field oxide areas and concurrently diffusing in said dopant in said substrate, and removing said silicon nitride layer, and completing said doped well regions and said doped field regions under said field oxide.

2. The method of claim 1, wherein said semiconductor substrate is composed of single crystal silicon doped with the P-type dopant boron (B).

3. The method of claim 1, wherein said semiconductor substrate is composed of single crystal silicon doped with the N-type dopant Arsenic (As).

4. The method of claim 1, wherein said pad oxide layer is silicon oxide formed by thermal oxidation of said substrate having a thickness between about 100 to 500 Angstroms.

5. The method of claim 1, wherein said silicon nitride ($Si_3N_4$) layer is deposited by chemical vapor deposition having a thickness of between 800 to 2000 Angstroms.

6. The method of claim 1, wherein said silicon nitride layer is anisotropically plasma etched in an etchant gas of sulphur hexafluoride ($SF_6$) and helium (He).

7. The method of claim 1, wherein said ion implantation dopant is boron ($B^{11}$) ions having an ion implant dose of between about 5 E 12 to 5 E 13 ions/$cm^2$ and an ion implant energy of between about 100 to 500 KeV.

8. The method of claim 1, wherein said ion implantation dopant is phosphorus ($P^{31}$) ions having an ion implant dose of between about 5.0 E 12 to 5.0 E 13 ions/$cm^2$ and an ion implant energy of between about 100 to 500 KeV.

9. The method of claim 1, wherein said selectively deposited insulating layer by liquid phase deposition is composed of silicon oxide having a thickness of between about 2000 to 6000 Angstroms.

10. The method of claim 1, wherein said liquid phase deposition is performed in a supersaturated aqueous solution of hydrofluorsilicic acid ($H_2SiF_6$) and boric acid ($H_3BO_3$) acid at a temperature of about 35° C.

11. The method of claim 10, wherein said aqueous solution of boric acid is added to said hydrofluorsilicic acid ($H_2SiF_6$) to maintain a supersaturated solution.

12. The method of claim 1, wherein said field oxide areas are formed by the method of local oxidation of silicon (LOCOS) having a thickness of between about 2000 to 8000 Angstroms.

13. A method for fabricating field effect transistors on doped wells in semiconducting substrate with self-aligned doped field regions and field oxide areas comprising the steps of:

providing a semiconductor substrate having a principle surface that is planar;

forming a blanket pad oxide layer on said substrate planar surface;

depositing a blanket silicon nitride layer on said pad oxide layer;

coating a photoresist layer on said silicon nitride layer; and patterning said photoresist layer leaving portions of said photoresist layer over planned device areas and exposing said silicon nitride layer elsewhere on said substrate over said field oxide areas;

anisotropic etching said silicon nitride layer to said pad oxide surface in said exposed silicon nitride areas;

depositing selectively by liquid phase deposition (LPD) an insulating layer on said pad oxide in said exposed areas;

removing said patterned photoresist layer over said device region;

implanting a dopant by ion implantation through said LPD insulating layer and through said silicon nitride and pad oxide layers, and thereby forming doped field regions in said substrate under said LPD insulating layer and self-aligned doped well regions under said silicon nitride and pad oxide layers;

etching selectively said LPD insulation layer and said pad oxide layer and exposing said substrate surface, and leaving said patterned silicon nitride layer elsewhere on said substrate;

thermally and selectively oxidizing said exposed substrate surface and thereby forming field oxide areas and concurrently diffusing in said dopant in said substrate; and removing said silicon nitride layer and said pad oxide layer, and thereby completing said doped well regions and said doped field regions under said field oxide regions; and furthermore forming field effect transistors (FETs) on said well regions by;

growing a gate oxide layer on the surface of said doped well regions, depositing a blanket doped polysilicon layer on said gate oxide layers and said field oxide areas, patterning said polysilicon layer by photoresist masking and anisotropic plasma etching, and thereby forming gate electrodes on said gate oxide, implanting dopants adjacent to said gate electrodes in said doped well regions and forming source/drain areas, and completing said FETs on said substrate.

14. The method of claim 13, wherein said semiconductor substrate is composed of single crystal silicon doped with the P-type dopant boron (B).

15. The method of claim 13, wherein said semiconductor substrate is composed of single crystal silicon doped with the N-type dopant Arsenic (As).

16. The method of claim 13, wherein said pad oxide layer is silicon oxide formed by thermal oxidation of said substrate having a thickness between about 100 to 500 Angstroms.

17. The method of claim 13, wherein said silicon nitride ($Si_3N_4$) layer is deposited by chemical vapor deposition having a thickness of between 800 to 2000 Angstroms.

18. The method of claim 13, wherein said silicon nitride layer is anisotropically plasma etched in an etchant gas of sulphur hexafluoride ($SF_6$) and helium (He).

19. The method of claim 13, wherein said ion implantation dopant is boron ($B^{11}$) ions having an ion implant dose of between about 5 E 12 to 5 E 13 ions/$cm^2$ and an ion implant energy of between about 100 to 500 KeV.

20. The method of claim 13, wherein said ion implantation dopant is phosphorus ($P^{31}$) ions having an ion implant dose of between about 5 E 12 to 5 E 13 ions/$cm^2$ and an ion implant energy of between about 100 to 500 KeV.

21. The method of claim 13, wherein said selectively deposited insulating layer by liquid phase deposition is composed of silicon oxide having a thickness of between about 2000 to 6000 Angstroms.

22. The method of claim 13, wherein said liquid phase deposition is performed in a supersaturated aqueous solution of hydrofluorsilicic acid ($H_2SiF_6$) and boric acid ($H_3BO_3$) acid at a temperature of about 35° C.

23. The method of claim 22, wherein said aqueous solution of boric acid is added to said hydrofluorsilicic acid ($H_2SiF_6$) to maintain a supersaturated solution.

24. The method of claim 13, wherein said gate oxide layer is formed by thermal oxidation having a thickness of between about 50 to 200 Angstroms.

25. The method of claim 13, wherein said doped polysilicon layer doped with N-type dopant atoms having a concentration of between about 1 E 19 to 1 E 21 atoms/cm$^3$.

26. The method of claim 13, wherein said source/drain areas are formed by implanting with N-type dopant ion having an ion implant dose of between about 1.0 E 13 to 1.0 E 15 ions/cm$^2$ and an implant energy of between about 20 to 80 KeV.

27. The method of claim 13, wherein said ion implantation through said LPD insulating and silicon nitride layers is achieved using two photoresist masking steps forming P doped well regions and N doped well regions on said substrate with P and N channel stop regions, respectively, and thereby providing for N channel and P-channel FETs for CMOS circuits.

* * * * *